United States Patent [19]

White et al.

[11] Patent Number: 5,136,249
[45] Date of Patent: Aug. 4, 1992

[54] PROBES FOR MEASUREMENT OF MOISTURE CONTENT, SOLIDS CONTENTS, AND ELECTRICAL CONDUCTIVITY

[75] Inventors: Ian White, Cook; Steven J. Zegelin, Kaleen, both of Australia

[73] Assignee: Commonwealth Scientific & Industrial Research Organization, Campbell, Australia

[21] Appl. No.: 623,915

[22] PCT Filed: Jun. 20, 1989

[86] PCT No.: PCT/AU89/00266
§ 371 Date: Dec. 12, 1990
§ 102(e) Date: Dec. 12, 1990

[87] PCT Pub. No.: WO89/12820
PCT Pub. Date: Dec. 28, 1989

[30] Foreign Application Priority Data

Jun. 20, 1988 [AU] Australia .................. PI8868

[51] Int. Cl.⁵ .................................. G01N 22/00
[52] U.S. Cl. .................................. 324/643; 324/642; 324/632
[58] Field of Search ............. 324/642, 643, 639, 640, 324/646, 690, 632; 333/238, 246, 239

[56] References Cited

U.S. PATENT DOCUMENTS

| | | |
|---|---|---|
| 4,006,481 | 2/1977 | Young et al. . |
| 4,278,935 | 7/1981 | Ihara et al. .................. 324/690 |
| 4,499,601 | 12/1984 | Rao et al. .................. 324/643 X |
| 4,544,880 | 10/1985 | Nagy et al. .................. 324/643 X |
| 4,626,773 | 12/1986 | Kroeger et al. . |
| 4,786,857 | 11/1988 | Mohr et al. . |
| 4,797,621 | 1/1989 | Anderson et al. . |
| 4,987,394 | 1/1991 | Harman et al. .................. 333/243 X |

FOREIGN PATENT DOCUMENTS

3317200 10/1984 Fed. Rep. of Germany .
2194340 3/1988 United Kingdom .

OTHER PUBLICATIONS

Can. Geotech J., 24, 1, pp. 160–163 (1987).

Primary Examiner—Jack B. Harvey
Attorney, Agent, or Firm—Leydig, Voit & Mayer

[57] ABSTRACT

Probes for the measurement of moisture content, solids content, and electrical conductivity of porous or fibrous materials, slurries, liquids, and the like using Time Domain Reflectometry comprising a conductive wire or rod extending outwardly from the embedded at one end in, a conductive base and insulated from the base by a region of dielectric material. The wire and base being dimensioned and spaced to emulate a coaxial transmission line with the wire or rod being the center conductor of the transmission line and the conductive base forming the coaxial shield.

6 Claims, 18 Drawing Sheets

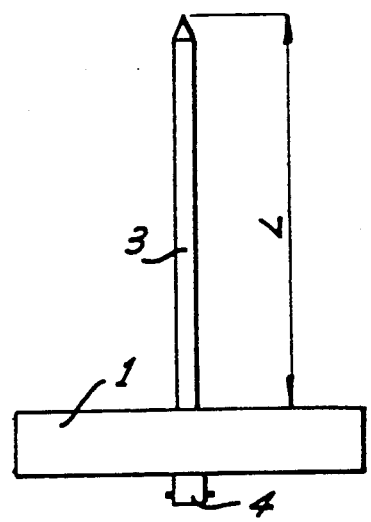
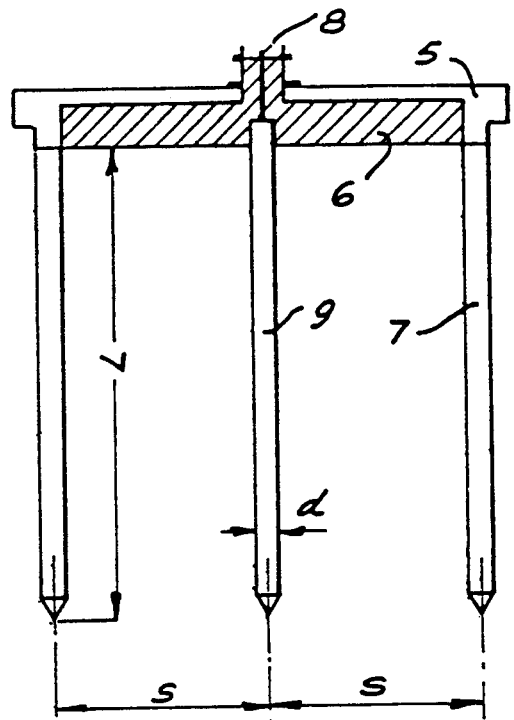
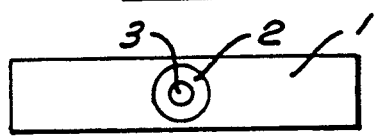
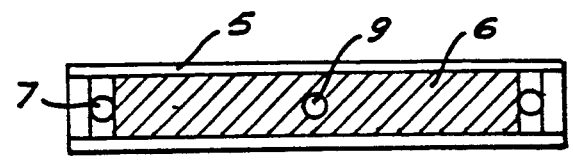
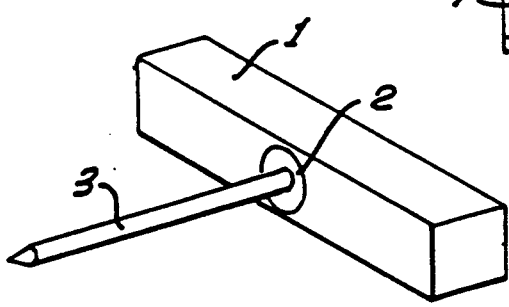
FIG.1a
FIG.1b
FIG.1c
FIG.2a
FIG.2b

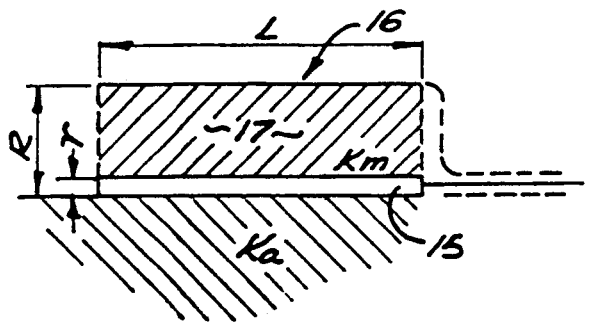
FIG. 10a
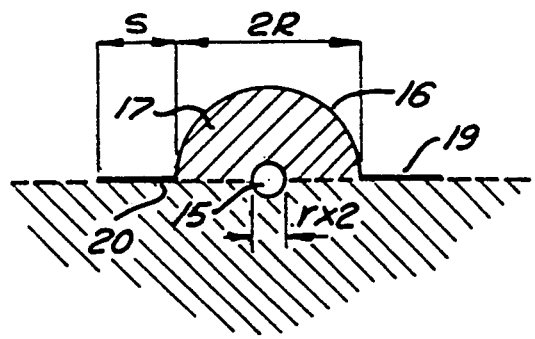
FIG. 10d
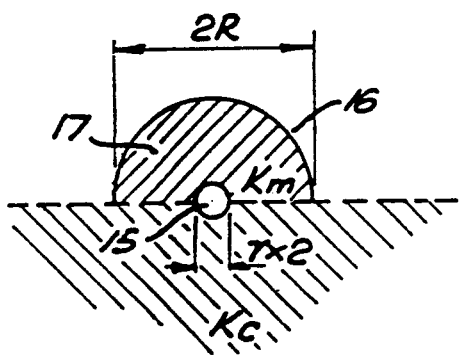
FIG. 10b
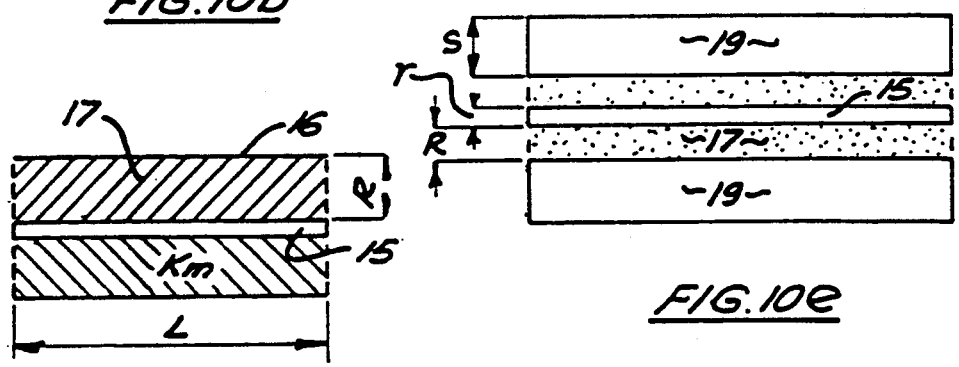
FIG. 10c
FIG. 10e Δ = 13.7mm.

PROBES FOR MEASUREMENT OF MOISTURE CONTENT, SOLIDS CONTENTS, AND ELECTRICAL CONDUCTIVITY

TECHNICAL FIELD

The present invention relates to the measurement of moisture content and electrical conductivity in porous and fibrous solids using Time Domain Reflectometry (TDR), in particular to improved probes for use in such measurement.

BACKGROUND ART

Present techniques involve the insertion of a parallel-wire or two-wire transmission line in the porous material. Here we describe improved insertion probes and new surface, non-insertion, TDR probes for volumetric water content, $\theta$, and electrical conductivity, $\sigma$, measurement. The probes can be used for $\theta$ and $\sigma$ measurement in porous solids, powders, slurries and liquids. The surface probes may be used on conveyor belts and for following drying of solids and films. The range of materials for which these probes may be used includes, but is not limited to soil, rock, coal, concrete, paper, wood, powders, oils, petroleum fluids, paints and paints and industrial slurries. It will be further understood that although the probes will be described in relation to specific measurement applications, the probes according to the invention are not limited to use in such applications.

The two-wire transmission line TDR probes currently in field use suffer from unwanted noise and information loss due to impedance mismatch between the probe and the coaxial connecting cable. Here we describe symmetric, multi-wire probes designed to minimize these problems and eliminate the need for a balancing transformer between probe and TDR device.

Analysis of the electric field distributions around these new probes shows that they emulate a coaxial transmission line and their measured characteristic probe impedances approach that of coaxial probes. Signals from the new probes permit more reliable and accurate $\theta$ and $\sigma$ measurement and are superior to those of two-wire probes with balancing transformer. The enhanced signal clarity of the new probes extends to sample diameters of at least 0.2 m. We show that electrical conductivity determined with the new probes is identical to that found with a coaxial cell and substantially different from that measured by a two-wire probe. We find that the Giese-Tiemann thin sample approach for estimating $\sigma$ can be adapted to these multi-wire probes and is superior to an existing measurement scheme. Non-insertion surface probes capable of determining $\theta$ and $\sigma$ close to surfaces and in thin films are also described.

The need for rapid, reliable and routine techniques for monitoring in situ volumetric water content $\theta$ and soil electrical conductivity $\sigma$ in hydrology, agriculture and in various aspects of civil engineering and industrial processes is obvious and needs no elaboration. Time Domain Reflectometry (TDR) appears to have the potential to provide these three desired characteristics, particularly for $\theta$-determinations and perhaps for $\sigma$ as well.

The coaxial transmission line cell used in laboratory studies is unsuitable for most field soils. Instead, parallel-wire or two-wire transmission line probes are inserted into the soil. Because the geometry of the two-wire probe differs from that of the coaxial cable connecting the probe to the TDR device, considerable signal and information loss occurs at the coaxial cable/probe interface. In an attempt to match the electrical characteristics a balancing transformer, or balun, is usually connected at the interface. However this transformer can itself be a source of unwanted noise and can cause difficulties in analysing the TDR signal, particularly in saline materials. This problem becomes acute in short probes ($\leq 0.25$ m). Since TDR is superior to other in situ techniques in the near soil-surface region, it is especially desirable to minimize uncertainty in signal analysis for shorter probes.

We describe here simple single and multi-wire probes which emulate coaxial transmission lines, eliminate the necessity for balancing transformers and reduce spurious noise and reflections. We present an analysis of the electric field around the probes and demonstrate their advantages for both water content and electrical conductivity measurement.

DISCLOSURE OF INVENTION

According to a first aspect the present invention provides a probe for use in the measurement of water content, solids content and electrical conductivity of porous materials, slurries, liquids and the like using Time Domain Reflectometry comprising a conductive wire or rod imbedded in a conductive mounting base, said wire or rod being insulated from said mounting base by a region of dielectric material, said wire and base being dimensioned and spaced to emulate a coaxial transmission line with the wire or rod being the centre conductor of the transmission line and the conductive base forming the coaxial shield.

For preference, the region of dielectric material is a substantially cylindrical plug located centrally in said mounting base and having said wire or rod imbedded therein. Preferably, the probe includes connector means for connecting to a coaxial line. The connector means being adapted to connect the conductive base to the shield of said coaxial line and the rod or wire to the centre conductor of the coaxial line.

According to a second aspect the present invention provides a multi-line probe for use in the measurement of water content, solids content and electrical conductivity of porous materials, slurries, liquids and the like using Time Domain Reflectometry comprising three or more spaced electrically conductive lines extending in parallel from a mounting base, one line being centrally located with respect to the other lines and insulated therefrom by a dielectric material, said lines being dimensioned and spaced to emulate a coaxial transmission line with the centrally located line being the centre conductor of the transmission line and the other lines forming the coaxial shield.

For preference the mounting base comprises a metal casing partly surrounding said dielectric material, said other lines being connected to said casing with said central line being insulated therefrom by said dielectric material.

A further aspect of the invention relates to the designs for surface probes which do not require insertion in the material. In operation these probes are merely placed against the material surface. Essentially they are "leaky" coaxial or strip transmission lines. We show that the probes give a signal whose definition and clarity is comparable with the coaxial simulating probes described herein. The sensititivity of these "leaky" coaxial lines are less than conventional insertion probes but accurate dielectric constant water-content calibration curves can still be constructed.

Analysis of the electric field around the probes shows that the depth of penetration of the field is comparable to the width of the probe. Use of probes of different radii therefore permits the water content of different depths of the porous material to be sampled. We envisage that these probes will find use in measuring the drying and wetting of various porous materials, for example soil, concrete, timber, paper, paints and oils, and in down-hole logging of liquid content with depth in both soils and rock.

According to this further aspect of the invention there is provided a surface probe for use in the measurement of moisture content, solids contents and electrical conductivity of porous materials, slurries liquids and the like using Time Domain Reflectometry comprising at least one centre conductor surrounded at least in part by a shield conductor spaced from said centre conductor by a dielectric filler medium, said centre conductor in use being placed in contact with the material whose characteristics are being measured.

For preference the shield conductor may be extended by means of wing extension portions extending outwardly from the base edge of said shield conductor.

A further embodiment of this probe comprises a conductive wire or rod supported in spaced relation from a conductive plate by spacer means of dielectric material, said spacer means arranged to allow material whose characteristics are to be measured to pass between said wire or rod and said plate. The plate emulates the shield conductor of a coaxial transmission line.

It will be appreciated that the shield conductor may be in the form of multiple wires, meshes or any other suitable form.

BRIEF DESCRIPTION OF DRAWINGS

Preferred embodiments and examples of measurement with these probes will now be described with reference to the accompanying drawings, in which:

FIGS. 1a–1c show plan, end elevation and perspective schematic representations of a single wire probe according to the invention;

FIGS. 2a–2c show sectional, plan and perspective schematic representations of a three wire probe according to the invention;

FIGS. 10a, 10b and 10c show respectively, a longitudinal sectional elevation view, an end section and an underneath view of the surface probe according to the invention;

FIGS. 10d and 10e show an end section and underneath view of the surface probe of FIG. 10a with the extended shield;

DESCRIPTION OF PREFERRED EMBODIMENTS

The design of the single-wire probe is shown schematically in FIG. 1. Each probe comprises a conductive head portion 1 surrounding a dielectric insert 2. A single wire or rod 3 extends substantially through the centre of the insert 2 and normal to head portion 1. A coaxial connector 4 is provided for connecting the central coaxial lead to the wire or rod 3 and the shield to the head portion 1. The length L is preferably less than 100 mm.

Figure 2C:
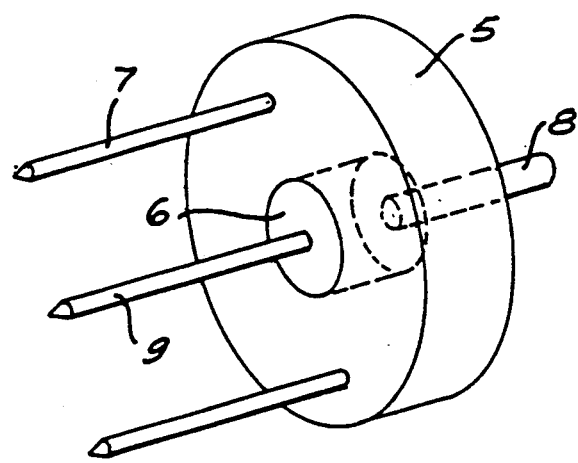

The design of the three-wire probe is shown schematically in FIG. 2. Each probe comprises a conductive head portion 5 surrounding a dielectric insert 6. The outer wires 7 are mounted to the head portion with the central conductor 9 passing through the insert for connection to coaxial line 8. The wires of the probe are parallel and coplanar with length L, wire spacing s, and wire diameter d.

In designing this probe we have attempted to emulate in a one-dimensional sense the geometry of the coaxial transmission line cell by connecting the centre conductor of the coaxial joining cable to the central wire, and the two outer wires of the probe to the coaxial shield.

Figure 3A:
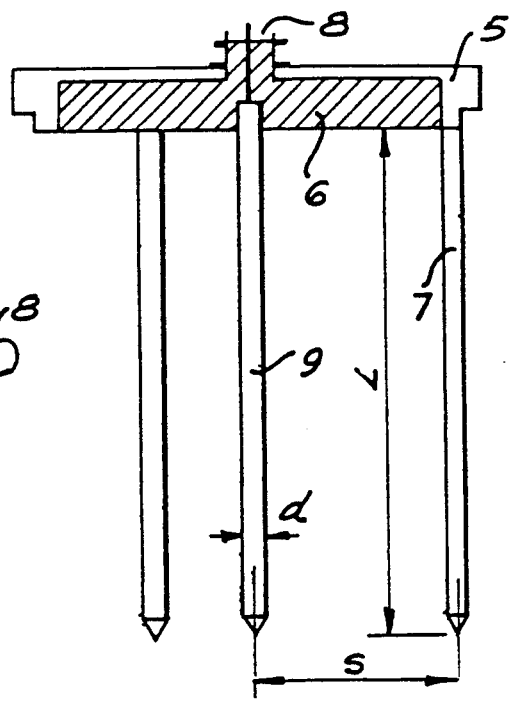
FIGS. 3a–3c show sectional, plan and perspective schematic representations of a four wire probe according to the invention.
Figure 3C:
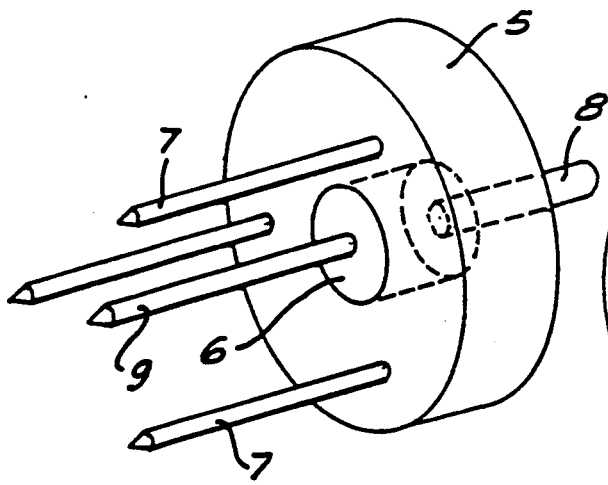
Figure 3B:
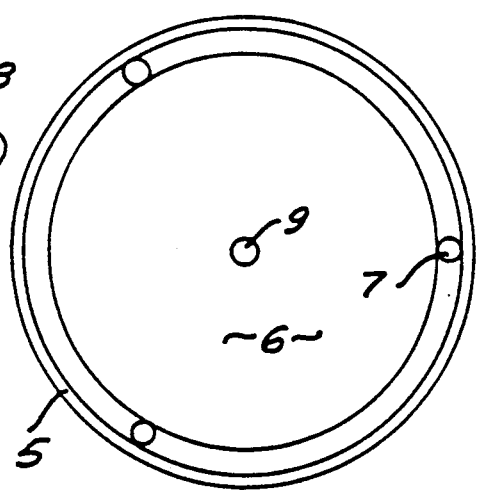

The design for the four-wire probe is shown in FIG. 3. Here the three outer wires are equally spaced around the circular perimeter of the probe and connected to the coaxial cable shield while the fourth inner wire is located at the centroid. Obviously multi-wire probes with more than three wires around the perimeter would more closely approximate a coaxial transmission line. As we shall show, the TDR information derived from the probes in FIGS. 2 and 3 closely approximates that of coaxial transmission line cells so that higher numbers of wires are unnecessary.

Figure 4A:
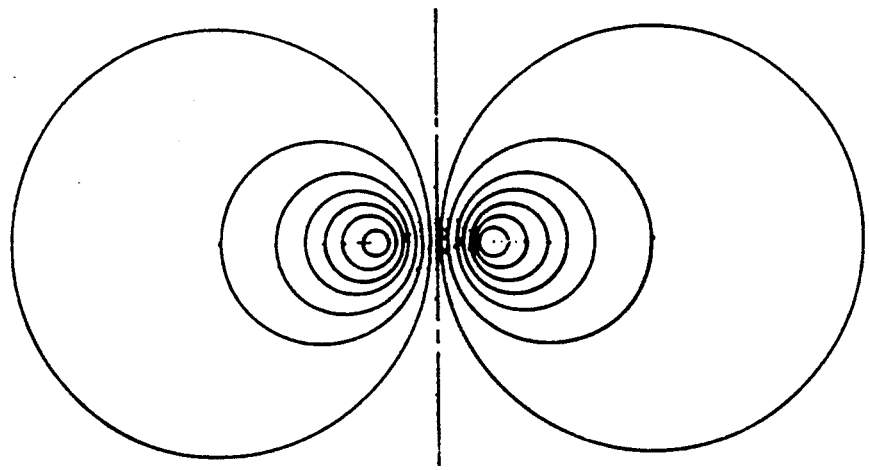
FIGS. 4a–4c show the calculated field distributions for two, three and four wire probes.
Figure 4B:
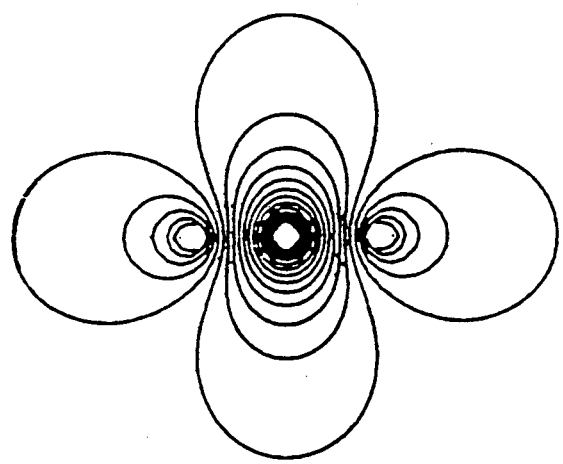
Figure 4C:
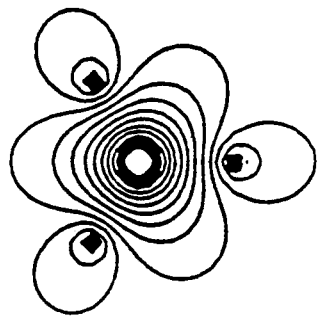
Figure 5A:
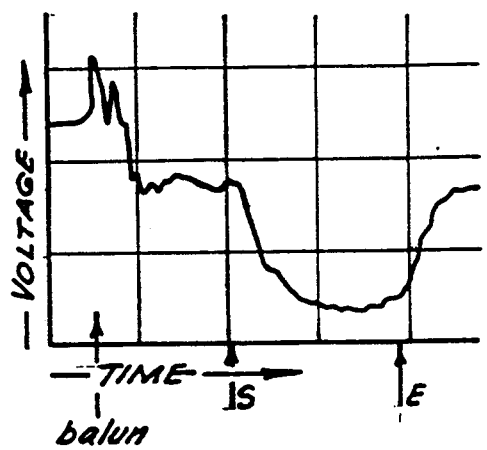
FIGS. 5a–5d show signal traces from a two wire probe with balun, three wire probe, four wire probe and a coaxial cell.
Figure 5C:
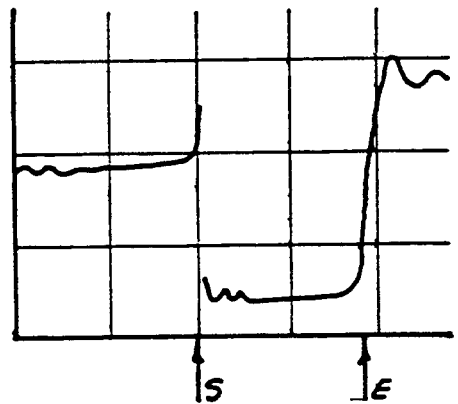
Figure 5B:
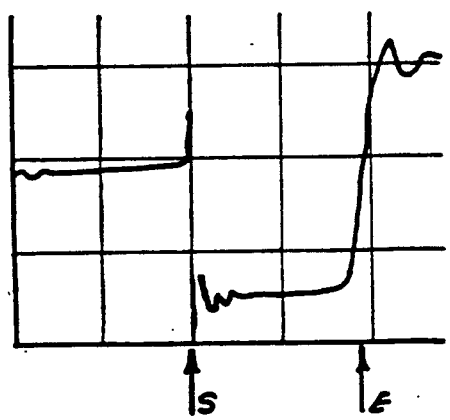
Figure 5D:
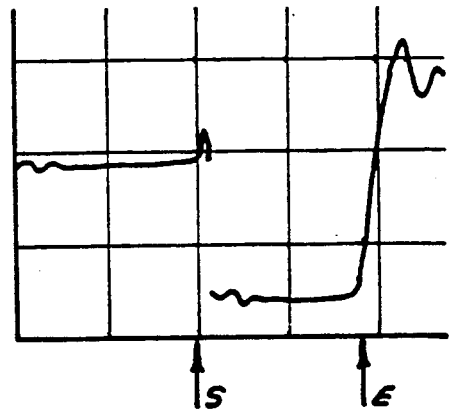

In order to test this we have calculated the electrical field distributions around the probes. FIG. 4 shows that the field distributions of the three- and four-wire probes provide increasingly better approximations to a coaxial cell in which the equipotentials are concentric circles centered on the inner conductor. We note here that the potential distributions in FIG. 4 do not tell us precisely what volumes of soil are sampled by the probes nor how information from various parts of the dielectric medium penetrated by the field is weighted in the resultant signal. They do, however, substantiate our claim that the probes in FIGS. 2 and 3 emulate coaxial cells. This suggests that we may safely dispense with the balancing transformer between probe and TDR device. We now examine whether this coaxial emulation improves TDR performance noticeably.

Characteristic Impedance

The characteristic impedance $z_o$ of a coaxial transmission line depends only on the geometry of the line $$z_o = 60 \ln(2s/d) \quad (1)$$

with 2s the diameter of the outer conductor and d that of the inner conductor. Alternatively, we can measure $z_o$ by determining the line's reflection coefficient $\rho_r$ when the line is filled with a uniform, dielectric material of dielectric constant $K_r$ [Kraus, 1984]:

$$z_o = z_i K_r (1+\rho_r)/(1-\rho_r) \quad (2)$$

with $z_i$ the output impedance of the TDR system and $\rho_r = (v_1/v_0)_r - 1$. Here $v_0$ is the signal amplitude from the TDR device and $v_1$ the amplitude of the signal after partial reflection from the start of the probe.

Although our probes are not coaxial lines, we may use the dimensions s and d, to estimate $z_o$ from (1) and compare it with measurements of $z_o$ from (2). Here s is the separation between outer or shield wires, and the centre wire of the probe. The closer the probe emulates a coaxial line, the closer we expect these two values to be. For this comparison it is essential that the reference dielectric have as small an electrical conductivity as possible so that $v_1$ may be determined unequivocally.

In Table 1 we show a comparison between the calculated geometric, Eq. (1), and measured, Eq. (2), characteristic impedances of three- and four-wire probes and a coaxial cell. All probes had L=150 mm, the reference dielectric was distilled water at 20° C. and the actual dimensions, s and d, of the probes used are given in the table.

The ratio of the geometric to the measured $z_o$ for the coaxial cell in Table 1 is not unity. Equation (1) is based on the assumption that there are no end effects. In our coaxial probe the bottom of the cell formed part of the outer conductor and we believe that the deviation from unity is due to an end effect. When that is taken into consideration, the ratios of the geometric to the measured characteristic impedance of the three- and four-wire probes fall 17 and 5%, respectively, below the ratio found for the coaxial cell. This confirms that these probes approximate coaxial cells. Because of reflections from the balun, (2) cannot be used successfully for two-wire probes.

Water Content Determination

In FIG. 5 we compare signals from three- and four-wire probes to those of a two-wire probe with balun (ANZAC type TP-103) and those of a coaxial cell, all with distilled water at 20° C. For this illustration, probes with L=150 mm, d=4.7 mm, and s=30 mm have been used, and the coaxial cell has length L=150 mm, inner conductor diameter 4.7 mm and outer conductor diameter 72.8 mm.

The oscilloscope (Tektronix 7S12 TDR/Sampler with S52 Sample Head and S6 Pulse Generator in a 7603 Oscilloscope) traces in FIG. 5 clearly show improved signal clarity for the three- and four-wire probes over that of the two-wire probe with balun. Both the noise due to the balun and the less precise signal for the two-wire probe are evident. In addition, the signals from the three- and four-wire probes are almost identical to that of the coaxial cell. Similar comparisons are found with the probes in air and in soil.

Use of TDR two-wire probes without balun has been claimed to give water content results consistent with those in which a balun is included. There is, however, a greater risk of encountering stray voltages and currents which increase measurement uncertainties without a balun. The argument over whether the inclusion of a balun, necessary in theory, is required in practice become irrelevant with the use of the three- and four-wire probes.

Figure 6:
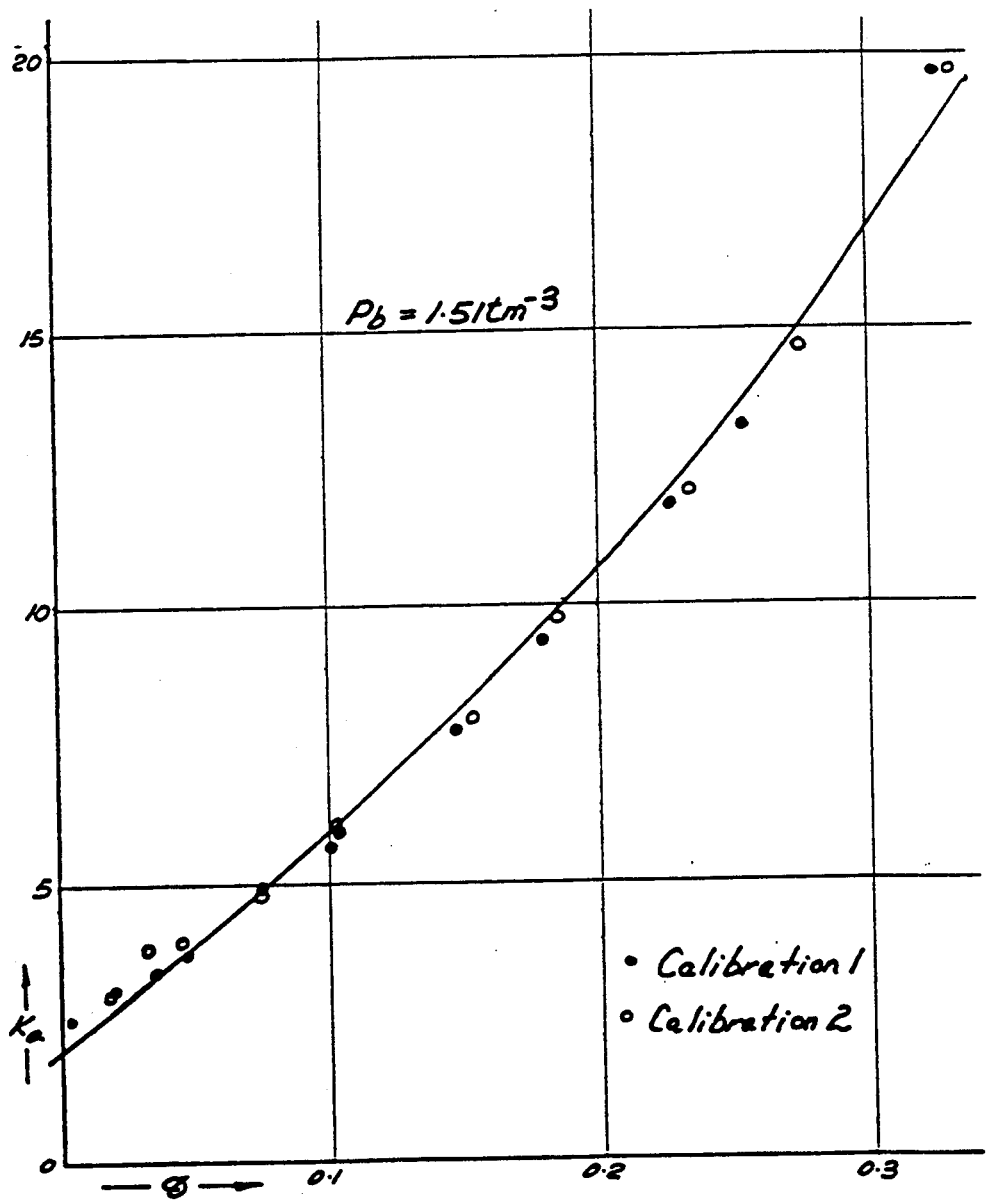
FIG. 6 shows a typical soil-water content dielectric constant calibration curve for a three wire probe.
Figure 7A:
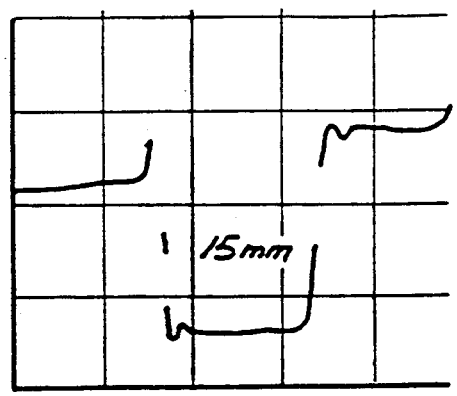
FIG. 7 shows oscilloscope traces for a three wire probe with varying wire spacings.
Figure 7D:
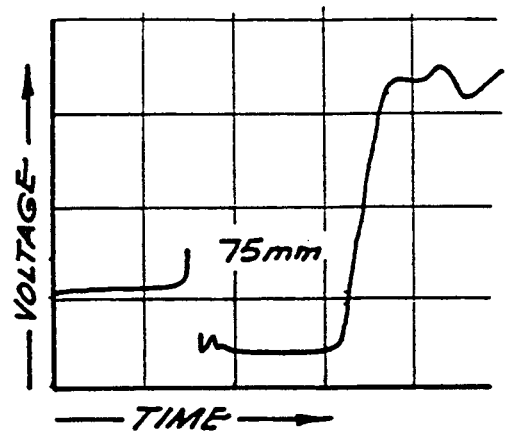
Figure 7B:
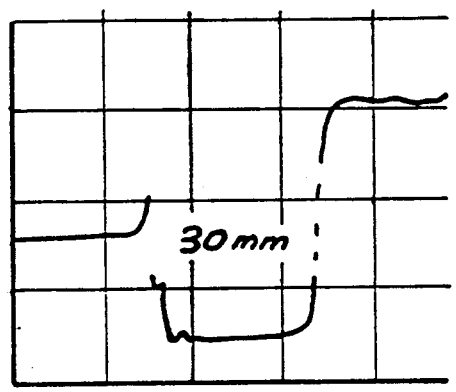
Figure 7E:
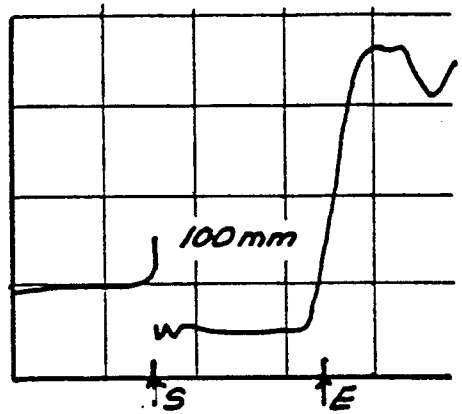
Figure 7C:
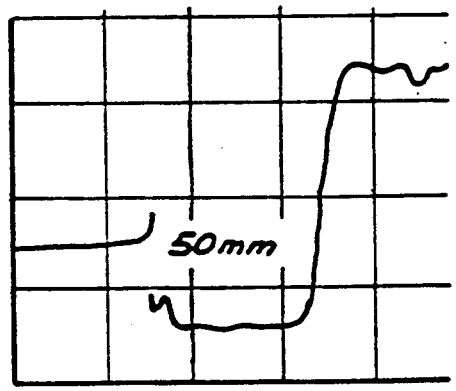

FIG. 6 shows a typical soil-water content-dielectric constant calibration curve for the three-wire probe. The apparent dielectric constant $K_a$, was found using the method described by Topp et al. [1980] (Electromagnetic determination of soil water content: Measurements in coaxial transmission lines, Water Resources Research, 16, 574–582, 1980) and is plotted against the volumetric water content $\theta$ determined by conventional oven drying at 105° C. for Bungendore fine sand. A probe with dimensions L=150 mm, d=4.7 mm, s=30 mm was used. We also compare this with the line of best fit found by Topp et al. [1980] for a variety of soils. The calibration curve found here closely follows that of Topp et al. [1980] except perhaps at the dry end. Differences at the dry end may be expected since the dielectric constants of soil minerals dominate $K_a$ in this region.

Effect of Wire Spacing

The superiority of the three-wire probe is not confined to the particular physical dimensions of the probes used for FIGS. 5 and 6. It has been found to extend to centre-wire to shield-wire spacings of between 15 and 100 mm, i.e. to total probe widths of 200 mm. In FIG. 7 we compare oscilloscope traces for three-wire probes inserted in water; all probes have L=150 mm and d=4.7 mm with s varying from 15 to 100 mm. The measured $K_a$ from these traces for each of the centre-wire to shield-wire spacings are identical. This means that soil volumes with typical dimensions of at least 200 mm can be sampled easily and accurately using the three-wire probe. We expect that these results hold for the full permissible range of L, d and s for which signal transmission is in the transverse electric and magnetic (TEM) mode.

Electrical Conductivity Measurement

It has been proposed recently that the attenuation of the reflected TDR signal can be used to infer electrical conductivity $\sigma$. In this application $K_a$ and voltage levels at various positions along the TDR probe are used to estimate the DC electrical conductivity $\sigma$ of the medium.

It is essential for $\sigma$ determination that the impedance and electrical geometry of the probe be matched as closely as possible to those of the coaxial cable connecting the probe to the TDR device. Otherwise attenuation and spurious reflections swamp the information on conductivity in the signal. Two-wire probes present problems here since the balun acts as an attenuator. This application, then, represents a critical test of coaxial-emulating multi-wire probes.

Two methods of inferring electrical conductivity at zero frequency using TDR have been used. In the method of Dalton et al. [1984] (Time Domain Reflectometry: simultaneous measurement of soil water content and electrical conductivity with a single probe, Science 224, 989-990, 1984) $\sigma$ is estimated from the TDR trace using the signal amplitude from the TDR device $v_0$, the signal after partial reflection from the start of the probe $v_1$, and the amplitude of the signal after reflection from the end of the probe $v_2$ (see FIG. 5). We denote this estimate of $\sigma$ as $\sigma_T$.

Equations (4) to (8) of Topp et al. [1988] (The determination of electrical conductivity using TDR: soil and water experminents in coaxial lines, Water Resources Research 1988) may be manipulated to give $$\sigma_T = [K_a^{\frac{1}{2}}/(120\pi L)]ln[v_1(2v_o-v_1)/(v_o(v_2-v_1))]. \quad (3a)$$

The inclusion of $v_2$ poses a problem experimentally. Topp et al. [1988] pointed out, that the frequency-dependent attenuation makes $v_2$ a somewhat arbitrary measure. To overcome this Yanuka et al. [1988] (Multiple reflection and attenuation of TDR pulses: Theoretical considerations for applications to soil and water, Water Resources Research, 1988) introduced a multiple reflection model and used the amplitude of the signal, $v_f$, after all reflections within the cell had taken place. Combining their equations (8), (19), and (26) we find $$\sigma_T = [K_a^{\frac{1}{2}}/(120\pi L)]ln\ [(v_1v_f-v_o(v_1+v_f))/(v_o(v_1-v_f))] \quad (3b)$$

The second method relies on the thin sample analysis of Giese and Tiemann [1975] (Determination of the complex permittivity from thin-sample time domain reflectometry, Adv. Mol. Relaxation Process, 7, 45-49, 1975), which gives estimates of $\sigma$ which we designate $\sigma_{G-T}$, through [Clarkson et al., 1977] (An appreciation of experimental factors in time-domain spectroscopy, Adv. Mol. Relaxation Interaction Process, 10, 173-202, 1977):

$$\sigma_{G-T} = (\epsilon_o c/L)(z_o z_i)[(2v_o/v_f)-1] \quad (4)$$

with $\epsilon_0$ the permittivity of free-space $\approx(36\pi)^{-1}\times10^{-9}$F.m$^{-1}$; c the velocity of electromagnetic waves in free space $\approx 3\times 10^8$m.s.$^{-1}$; $z_o$ the characteristic impedance of the TDR probe in free space (or air if no free-space is available); and $z_i$ the output impedance of the TDR system.

Despite the Giese and Tiemann analysis being theoretically valid for samples only a few millimeters thick, Topp et al. [1988] found, in coaxial cells, that $\sigma_{G-T}$ gives better estimates than $\sigma_T$. To calculate $\sigma_{G-T}$ for the multi-wire probes, we estimate $z_o$ in (4) using (2). We find that $$\sigma_{G-T} = [K_r^{\frac{1}{2}}(120\pi L)][(\rho_r+1)/(1-\rho_r)][(2v_o/v_f)-1] \quad (5a)$$

The first two bracketed terms on the right-hand side of (5a) contain terms which are characteristic of the probe. Once measured they are fixed and only measurements of $v_o$ and $v_f$ are required. Alternatively, for a sample with dielectric constant $K_a$ (16a) can be rewritten as $$\sigma_{G-T} = [K_r^{\frac{1}{2}}/(120\pi L)](v_1/v_f)[(2v_o-v_f)/(2v_o-v_1)], \quad (5b)$$

and we are now in a position to find $\sigma_{G-T}$ for multi-wire probes.

Conductivity of Electrolyte Solutions

We have used both (3b) and (5a) to estimate the electrical conductivity at 20° C. of a series of aqueous NaCl solutions whose concentration ranged from 0 to 0.05 M. The actual electrical conductivity $\sigma$ of these solutions was also measured using a conventional platinum dip cell and AC conductivity bridge at 1-20×10³ Hz.

Figure 8A:
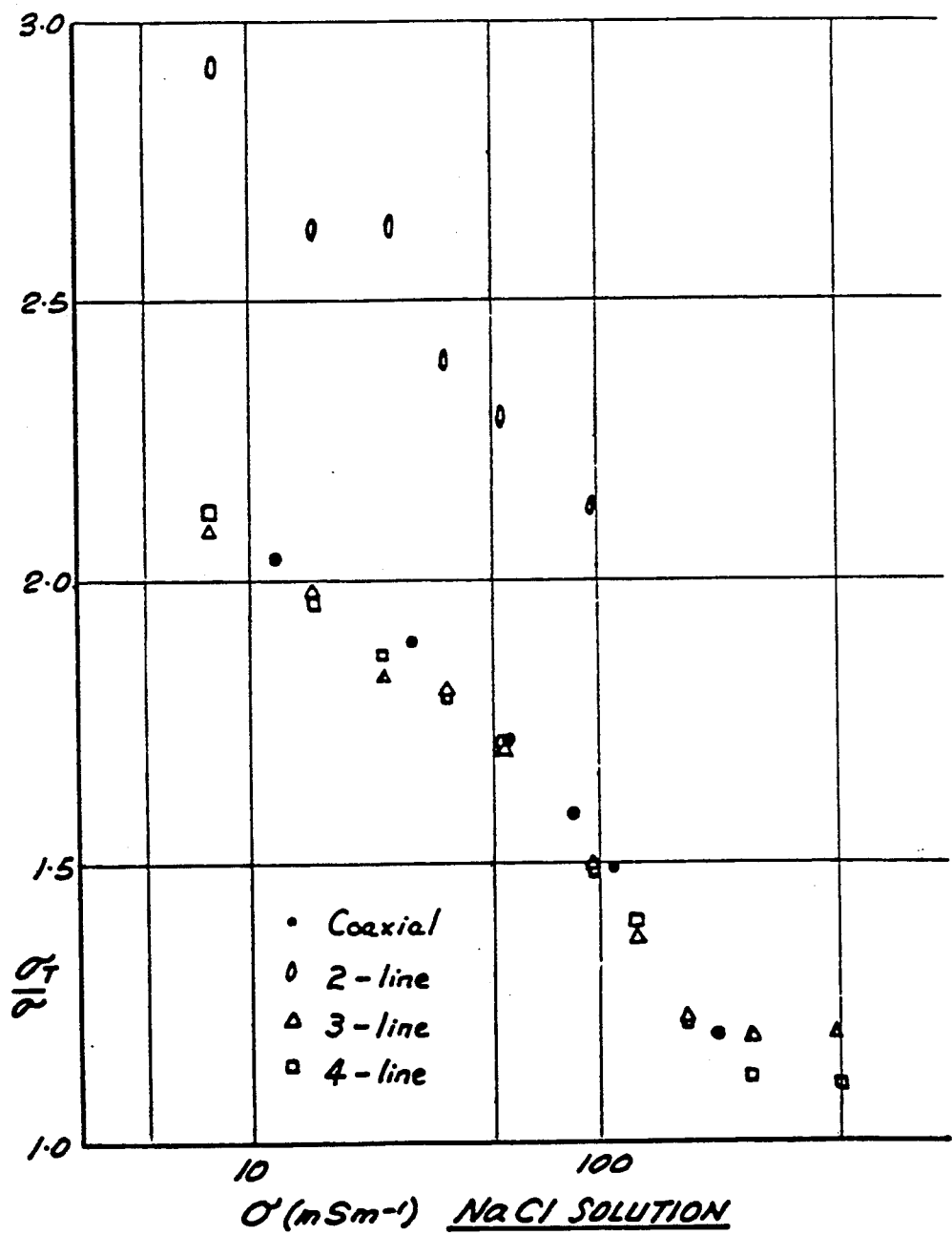
FIG. 8a shows the ratio $\sigma_T/\sigma$ as a function of $\sigma$ for two, three and four wire probes.

FIG. 8 gives the ratio $\sigma_T/\sigma$ as a function of $\sigma$ for the two-, three-, and four-wire probes, and the coaxial cell. The two-wire probe incorporated a balun. The three- and four-wire probes and the coaxial cell behave identically, but the two-wire probe differs significantly. The signal clarity for the two-wire probe was poor and the probe could not be used for solutions with $\sigma > 100$ mS.m$^{-1}$. In addition, $\sigma_T \approx 2\sigma$ for the three- and four-wire and coaxial probes and $\sigma_T \approx 3\sigma$ for the two-wire probe. As $\sigma$ increases, $\sigma_T - \sigma$ for the coaxial and coaxial emulating probes.

Figure 8B:
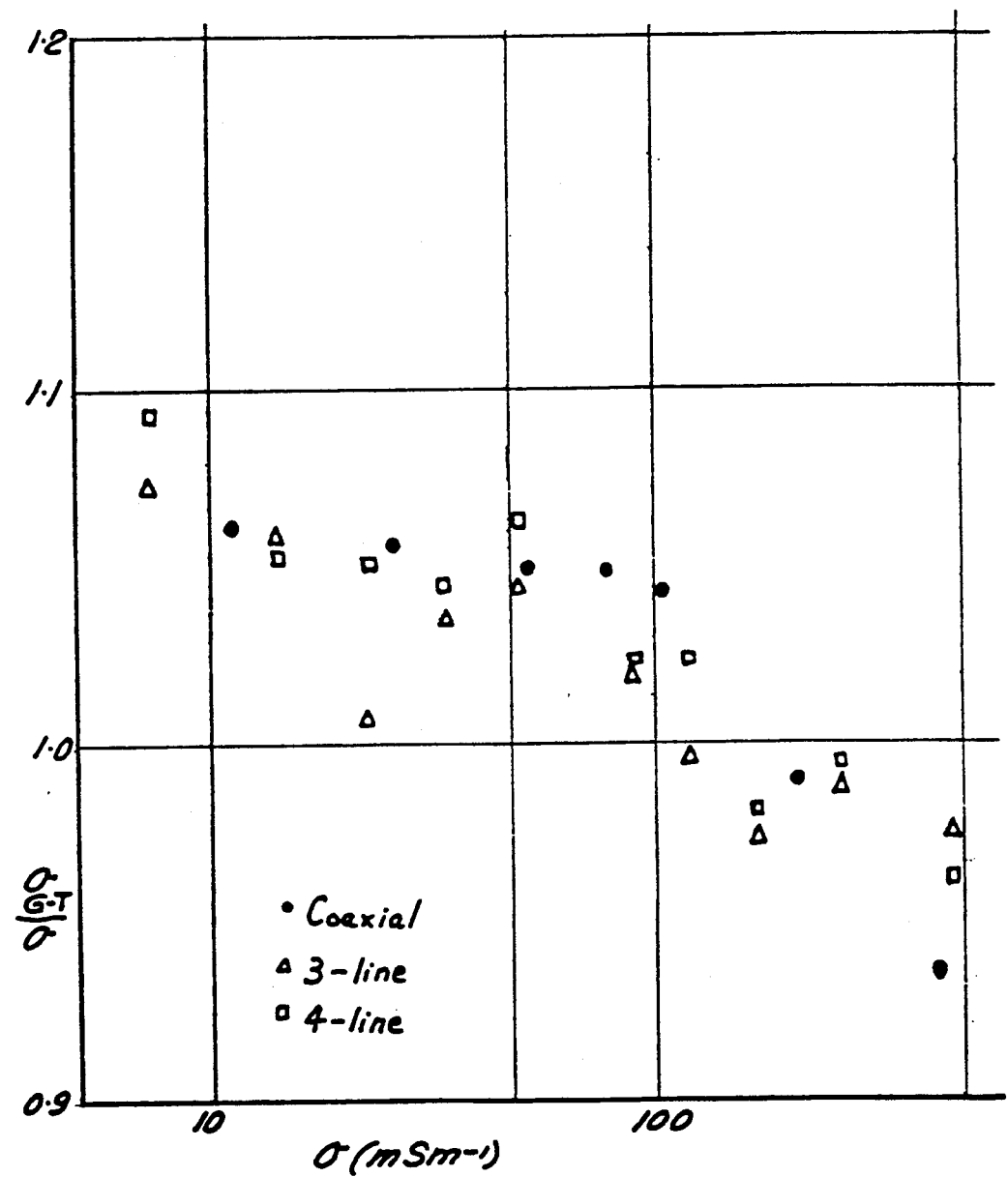
FIG. 8b shows the ratio $\sigma_{G-T}/\sigma$ as a function of $\sigma$ for sodium chloride solutions.

In FIG. 8b we show the ratio $\sigma_{G-T}/\sigma$ as a function of $\sigma$ for the NaCl solutions. Again there is no significant difference between the three- and four-wire probes and the coaxial cell. We see also that $\sigma_{G-T}$ is about 8% higher than $\sigma$ at the low electrolyte concentrations and decreases to about 5% lower than $\sigma$ for higher concentrations.

Use of $\sigma_T$ calculated from (3b) overestimates electrical conductivity. This was also found by Topp et al. [1988] and is hardly surprising since the measurement of $v_2$ in conducting solutions involves a frequency-dependent attenuation coefficient. Use of the Giese-tiemann approach, with our multi-wire probes provides estimates of $\sigma$ which are within ±10% for $7 < \sigma < 500$ mS.m$^{-1}$. This is in accord with the observations of Topp et al. [1988] for coaxial cells.

Conductivity of Soil

Figure 9:
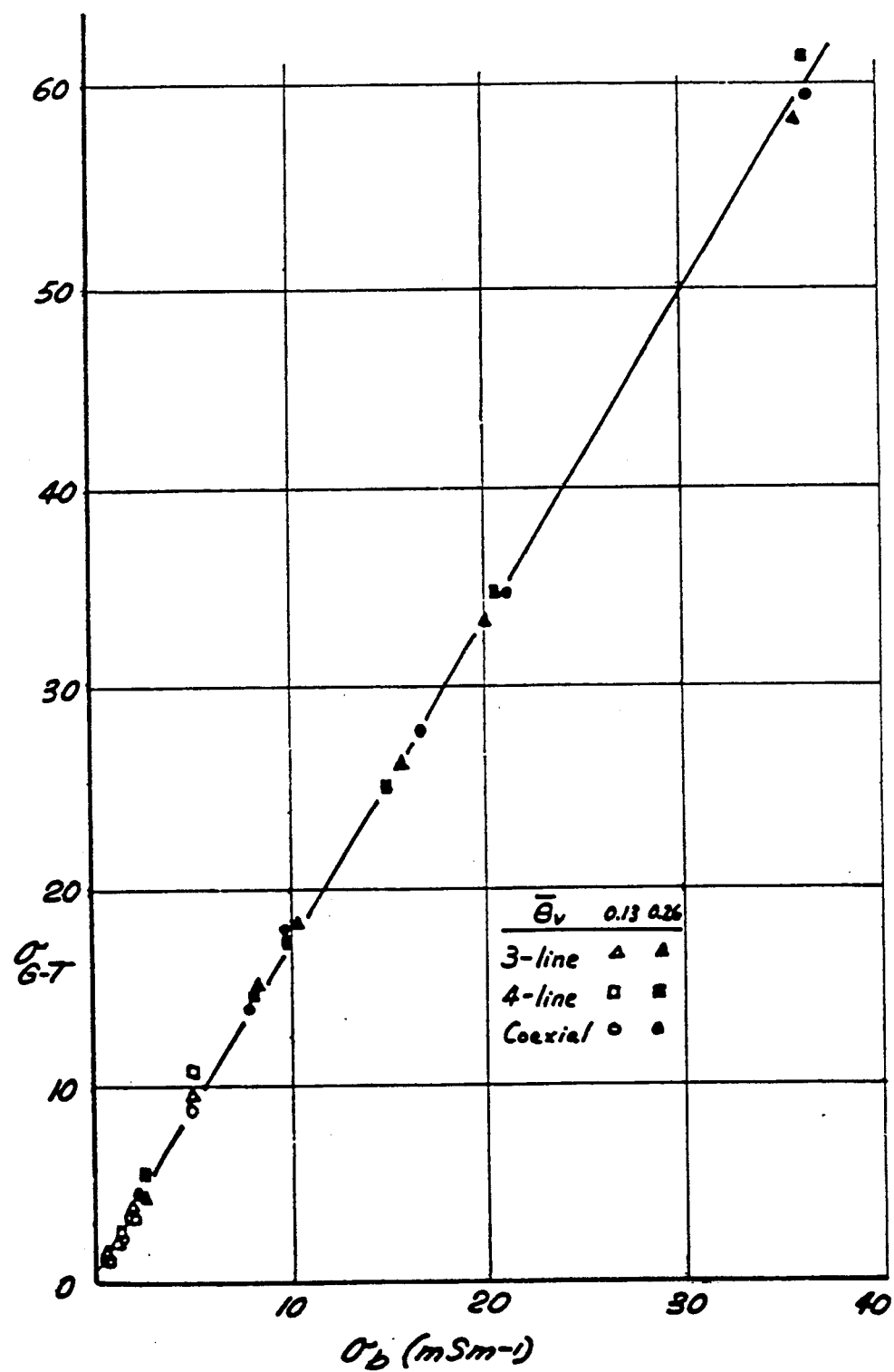
FIG. 9 shows a comparison of the performance of multi-wire probes and coaxial probes in determining the bulk electrical conductivity of soil.
Figure 11A:
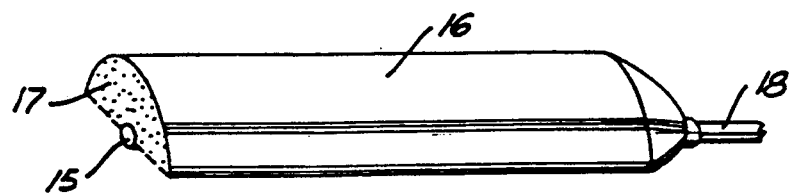
FIGS. 11a, 11b, 11c and 11d show upper and underside perspectives view of the probes of FIGS. 10a and 10d respectively.
Figure 11B:
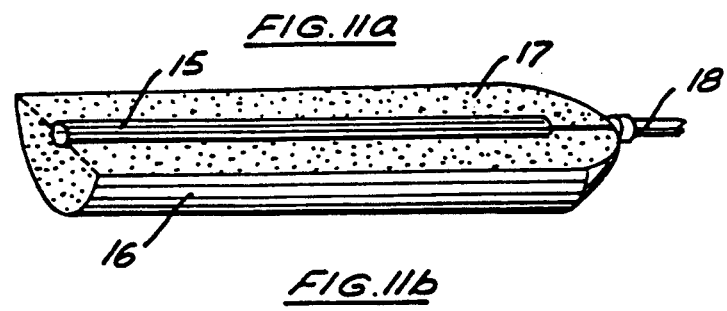
Figure 11C:
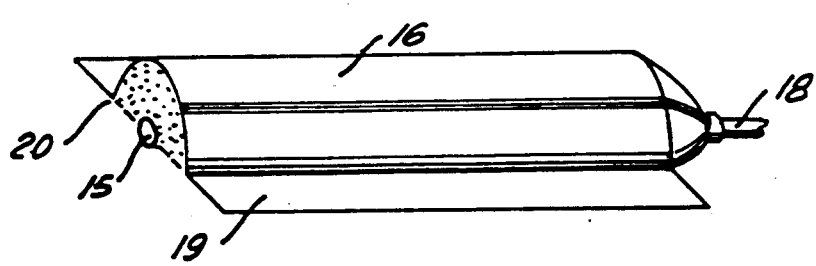
Figure 11D:
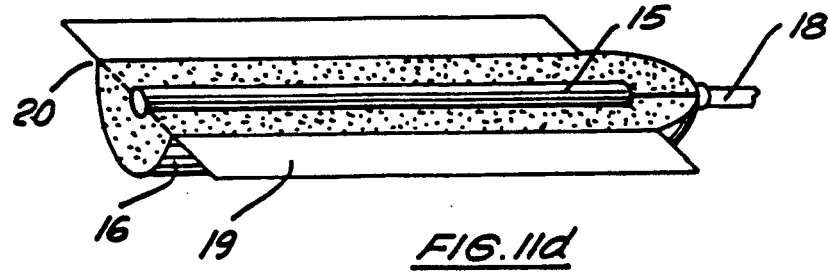

In FIG. 9 we compare the performance of the multi-wire and coaxial probes in determining the bulk electrical conductivity of soil. Here we have wet the soil, Bungendore fine sand, to two average volumetric water contents, $\theta = 0.13$ and 0.26, with aqueous NaCl solutions of between 0.005 and 0.05M.

Rhodes et al. [1976] (Effects of liquid-phase electrical conductivity, water content and surface conductivity on bulk soil electrical conductivity, Soil Science Society Am. J., 40, 651-655, 1976) proposed that the bulk soil electrical conductivity $\sigma_b$ should follow $$\sigma_b = \sigma_w(a\theta^2+b\theta)+\sigma_s \quad (6)$$

with $\sigma_s$ the conductivity of the soil-water solution, $\sigma_s$ the bulk conductivity due to surface conduction, and a and b soil-dependent empirical constants. Rhodes et al. [1976] list values of a and b for a few select soils. Although none of these resemble Bungendore fine sand, we arbitrarily select Indio vfsl. as comparable and take a $= 1.29$ and b$= -0.116$, $\sigma_s \approx 0$ and use our conventionally measured values of $\sigma_w$ for the NaCl solutions to estimate $\sigma_b$.

In FIG. 9 we show the results of using Eq. (5) to estimate $\sigma_b$. Again we see that the three- and four-wire probes behave identically to the coaxial cell. The linear relationship between $\sigma_{G-T}$ and $\sigma_b$ suggests that the general form of (6) is plausible. The slope of the line, 1.67, indicates however that the values of a and b for Bungendore sand need to be increased by ⅔. This would put Bungendore sand in the "clay" class in the list of Rhoades et al. [1976].

We have described here new single, three- and four-wire TDR probes designed to overcome difficulties with existing two-wire insertion probes. Analysis of the electric field distribution around probes show that the single, three- and four-wire probes emulate coaxial transmission line cells and minimise impedance mismatch which occurs with two-wire probes. Measurement of the characteristic impedance of the probes supports these calculations.

The signals from the new probes, which do not require balancing transformers, are more precise and less noisy than existing field probes with balancing transformer. This increased signal clarity is particularly useful for microprocessor-controlled TDR devices which give direct readings of water content. In addition, we have demonstrated that these improvements extend to center wire to shield-wire spacings of at least 0.1 m for the three-wire probe. This permits porous material volume with diameters of at least 0.2 m to be sampled.

In estimating electrical conductivity from TDR signal attenuation using the multi-wire probes, we have shown that the seemingly physically inappropriate Giese-Tiemann thin layer model gives more reliable estimates of electrical conductivity than the method used by Dalton et al. [1984]. This is in accord with the findings of Topp et al. [1988], for coaxial cells. For this application the performances of multi-wire probes were indistinguishable from that of a coaxial cell.

The three- and four-wire probes have very similar characteristics in the determination of both $\theta$ and $\sigma$. Both probes have superior performance to existing two-wire probes.

The designs of various surface probes are shown in FIG. 10. In FIGS. 10a, 10b and 10c we show types which are essentially coaxial lines cut in half. Each surface probe comprises an inner conductor 15 surrounded by semi-circular shield conductor 16 spaced from the inner conductor 15 by a dielectric filler 17. The inner conductor 15 is connected to the inner conductor of a coaxial signal line 18 and the outer conductor 16 is connected to the shield of this coaxial line 18. In essence these surface probes may be thought of as "leaky" strip lines in which the amount of coupling between the surface line and the underlying material may be varied by changing the geometry of the surface line and the composition of the dielectric separating the surface line and shield plane.

In FIG. 10d and 10e we show designs with the outer shield extended across the surface. The extensions are in the form of wing portions 19 extending outwardly from the base edges 20 of the shield conductor 16. These confine a greater part of the field to the material. The outer shield need not be semi-circular in cross section. We have chosen this shape for convenience.

A perspective view of the probes is shown in FIG. 11. The total probe inner radius, R, extended shield length, S, and inner conductor radius, r, may be varied and the probe length, L, depends on the application.

Figures 12A, 12C:
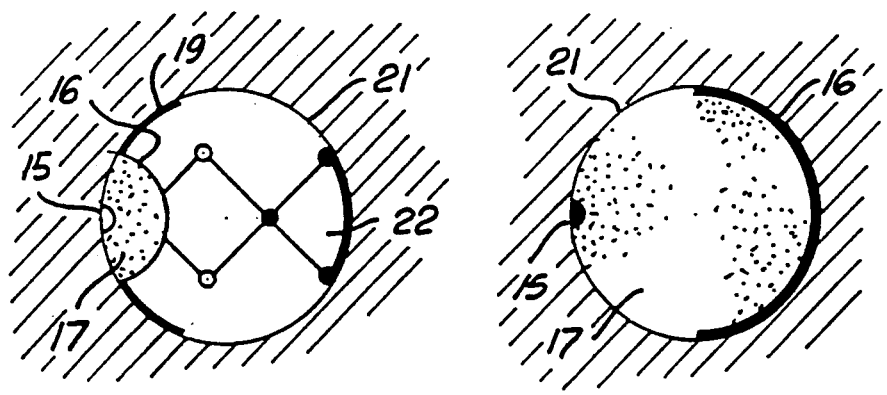
FIGS. 12a and 12b show an end section and perspective view of a surface probe for bore hole logging.
FIGS. 12c and 12d show an end section and perspective view of direct fit surface probe.
Figure 12B:
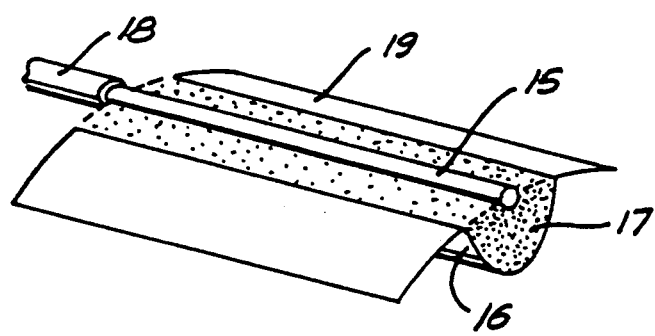
Figure 12D:
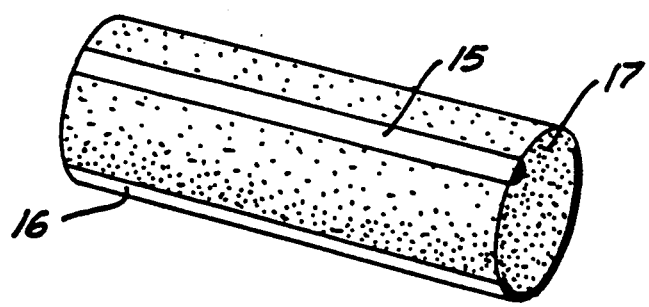

A shaped probe for use in logging liquid content in unlined bore holes in porous material is shown in FIG. 12. In this embodiment the outer shield conductor 16 is curved to fit into the bore hole 21 and is normally held against the side of the bore hole 21 by an expansion mechanism 22 as best shown in FIGS. 12a, and 12b.

Figure 13A:
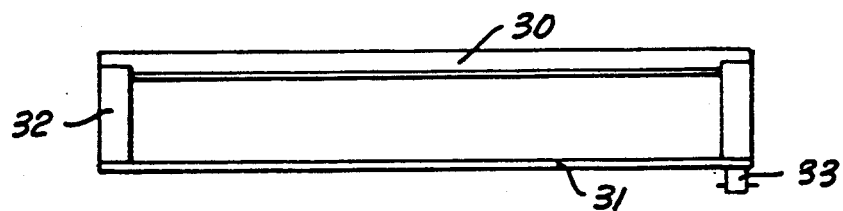
FIGS. 13a–13c show elevation, end elevation and perspective schematic representations of a second embodiment of a strip line probe according to the invention.
Figure 13B:
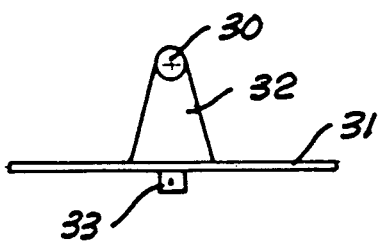
Figure 13C:
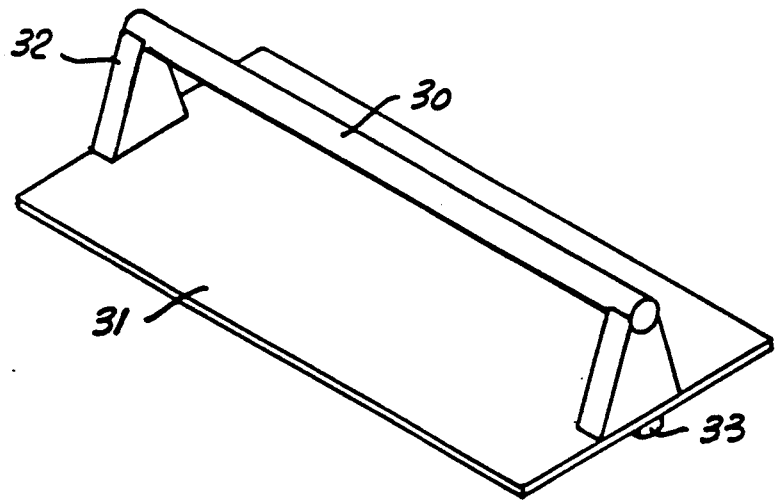

A further embodiment of the strip line conductor particularly applicable to moving material such as slurries or moving strips of solid material is shown in FIG. 13. The probe comprises a conductive rod 30 supported above a conductive plate 31 by a pair of support formations 32 formed of dielectric material. A coaxial connector plug 33 provides means for connecting the central conductor of a coaxial line to the rod 30 and the conductive plate 31 to the shield conductor of the coaxial line. The material to be measured passes between the rod 30 and the plate 31.

We have calculated the electrical field distributions for the essentially semi-circular probes as shown in FIGS. 10 and 11.

Figure 14:
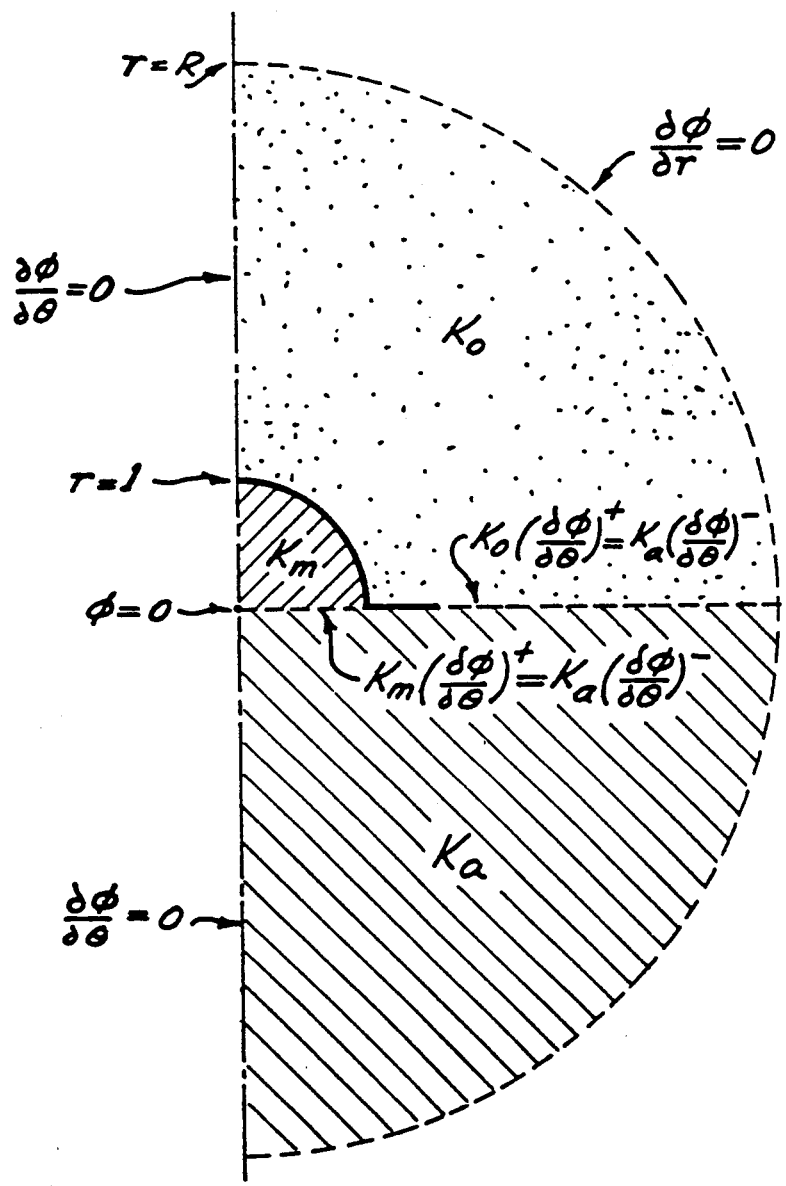
FIG. 14 show a graph of the configuration and boundary conditions for the numerical solution of Laplace's equation for a surface probe.

The electric field strength distribution depends on r, R, S, the dielectric constant of the material being measured, Ka, that of the surrounding atmosphere, $K_o \simeq 1$, and that of the filler material in the probe, $K_m$. The assumptions on which the calculations are based are shown in FIG. 14.

Figure 15A:
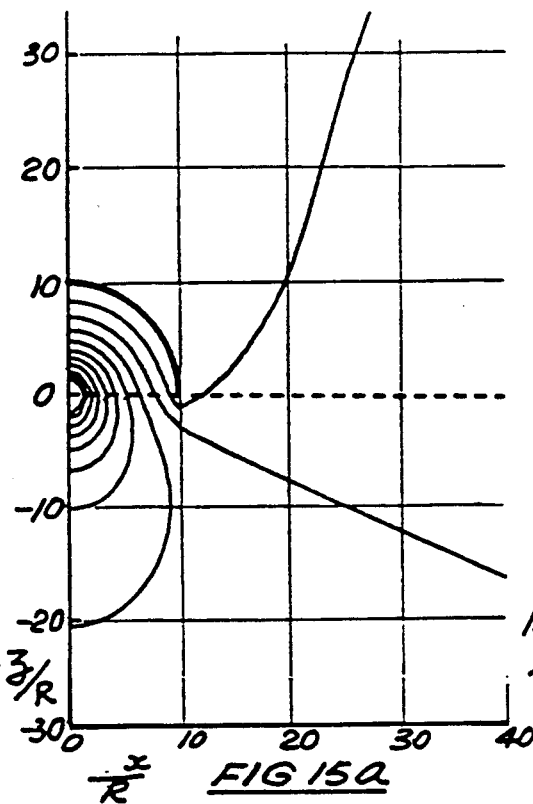
FIGS. 15a–15f show the dimensionless field distribution for various combinations of Ko:Km:ka for the surface probe without the shield extension.
Figure 15B:
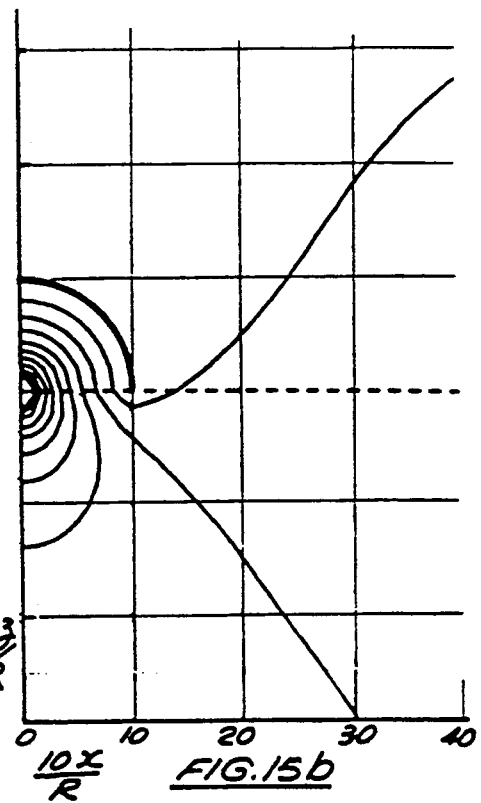
Figure 15C:
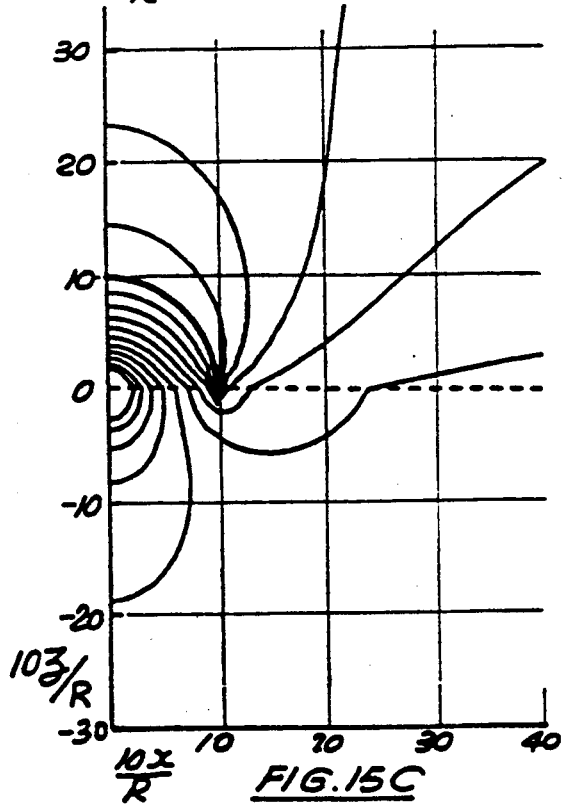
Figure 15D:
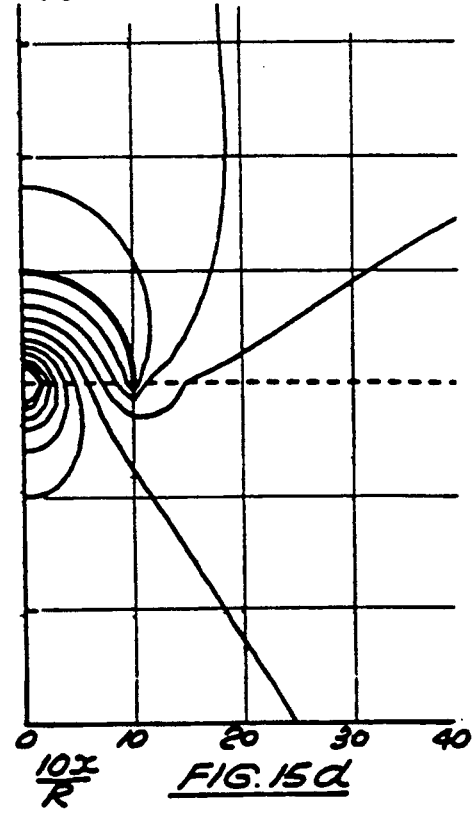
Figure 15E:
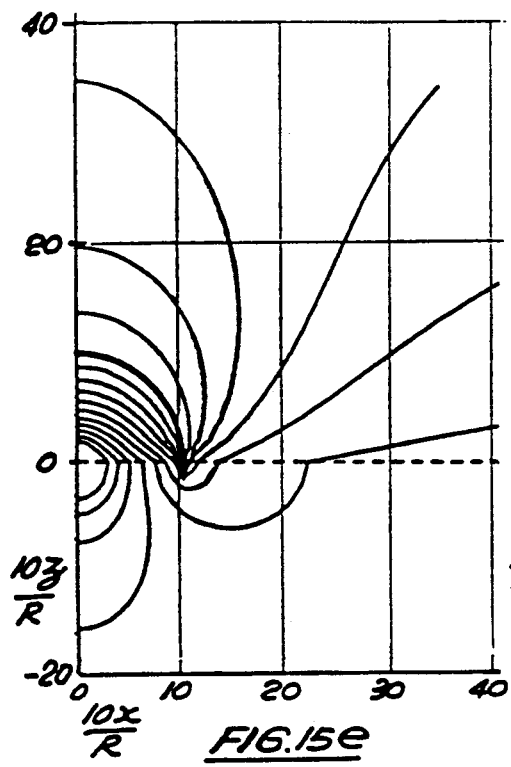
Figure 15F:
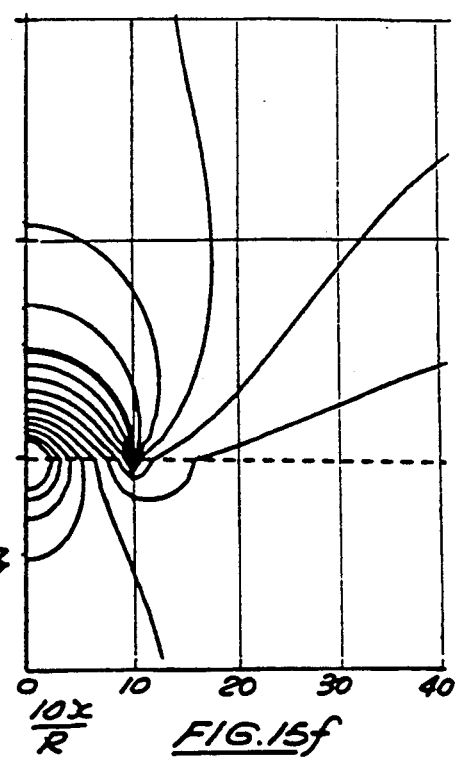

In FIGS. 15a, b, c, d, e, f, we show the dimensionless field distribution for various combinations of $K_o:K_m:K_a$ for the probe without shield extension. These show that as the dielectric constant of the filler material $K_m$ is increased, from that of air, the depth of field penetration into the material to be measured decreases. From this we see that the filler should have as low a dielectric constant as possible, $K_m > 3$. Plastics and especially foam plastics are therefore suitable.

Also in FIG. 15 we see that as the dielectric constant, $K_a$, of the material under study increases, the penetration depth decreases. These calculations show that the field penetration depth is comparable with the cross-sectional diameter of the probe. In the extreme case, when the material is water, $K_a \simeq 81$, considerable field leakage occurs outside the probe. To reduce this leakage we have extended the coaxial shield as in FIG. 11.

Figure 16A:
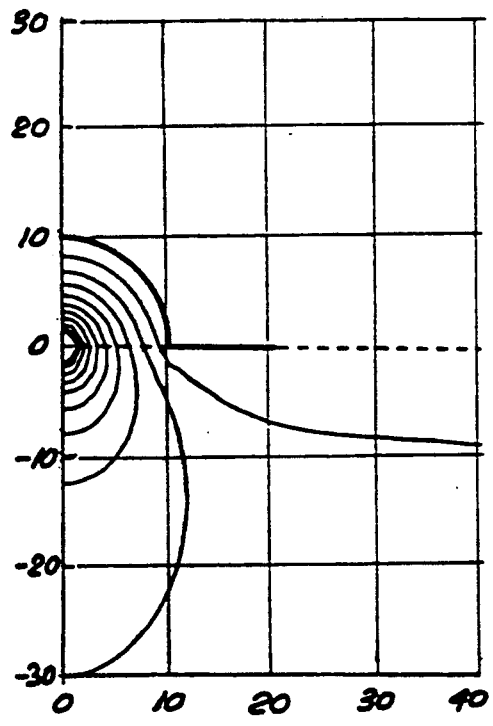
FIGS. 16a–16d show the field distributions of the extended shield surface probe.
Figure 16B:
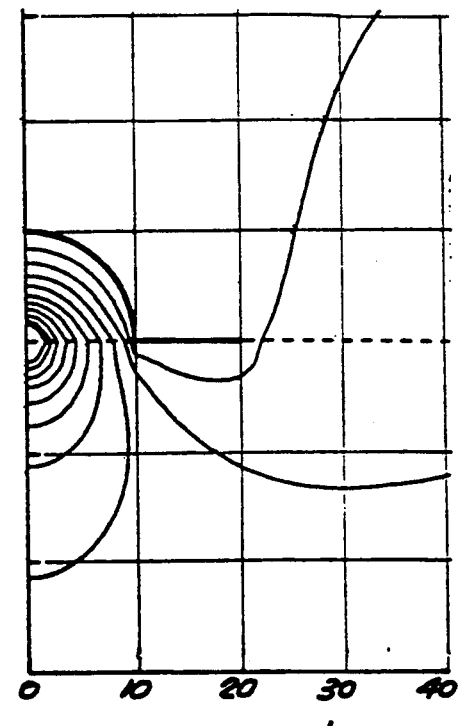
Figure 16C:
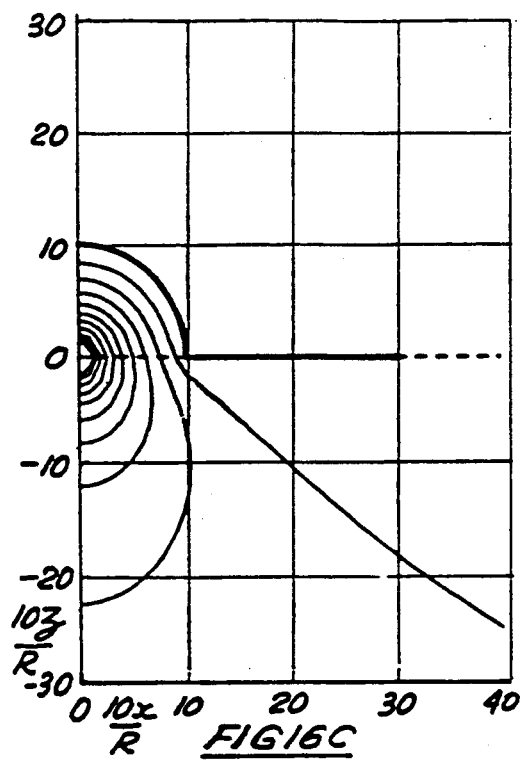
Figure 16D:
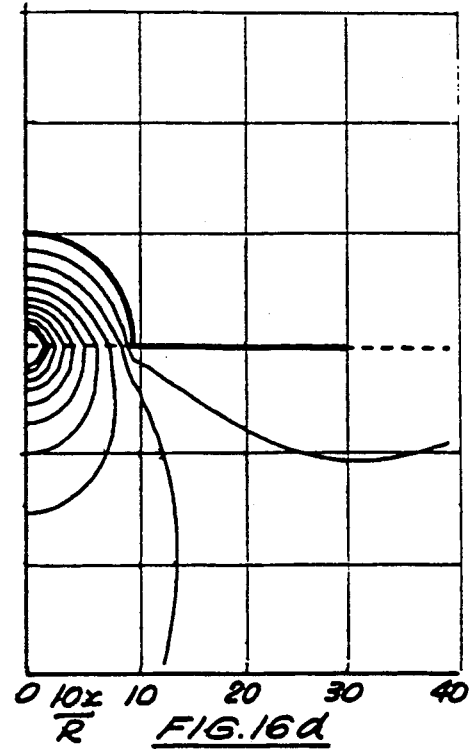

The field distribution around the extended surface shield probe is shown in FIGS. 16a, b, c, d. Here we have fixed $K_m = 1$ (air as the filler) and have looked at two extreme materials, air $K_a = 1$ and water $K_a = 81$. In FIGS. 16a and b we have fixed the shield extension length S=R and in FIGS. 16c and d, S=2R. Clearly extending the shield on the surface confines more of the field to the material under study and increases depth of penetration. These calculations suggest that extension of the shield to one or two times probe radius R should enhance its performance.

Figure 17A:
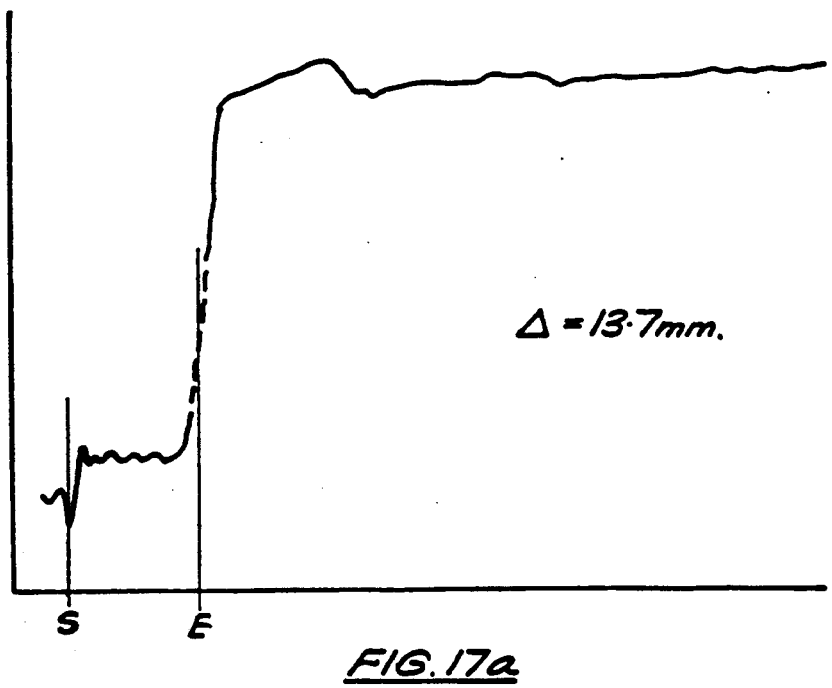
FIGS. 17a, b and c show oscilloscope traces illustrating the performance of surface probes when placed in contact with air, water and wet soil.

Oscilloscope traces showing the performance of a surface probe when placed in contact with air, water and wet soil are shown in FIGS. 17a, b and c. Here the probe is a non extended shield type of dimensions L=0.2 m, R=0.0095 m, r=0.0025 m and perspex was the filler. The unmistakeable reflection from the end of the inner conductor is clearly apparent in the Figure. The signal can be seen to be "clean" with a useable reflection for measurement purpose and compares well with the traces obtained with the coaxial simulating probes described herein.

Figure 17B:
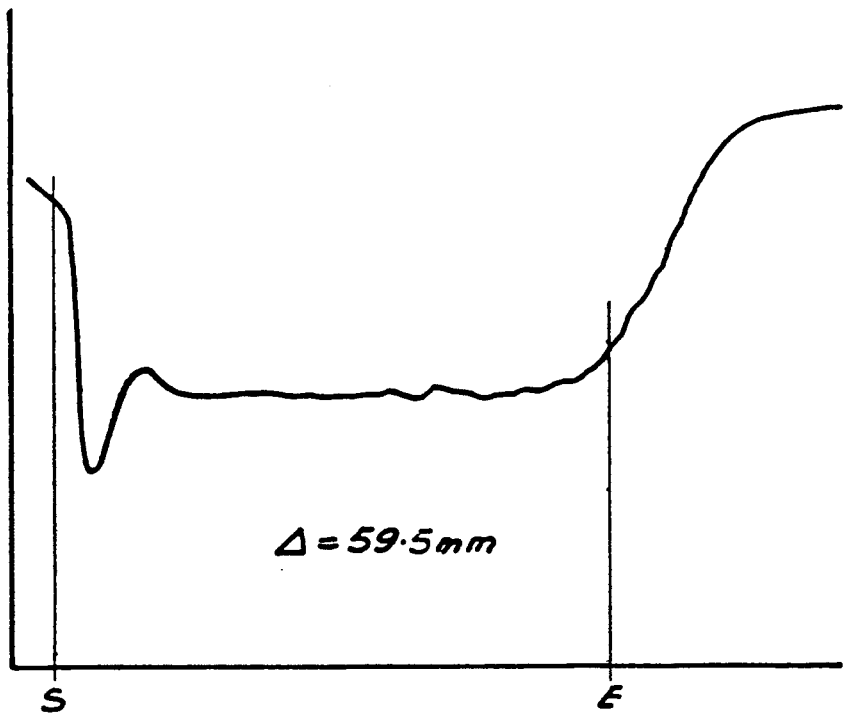
Figure 17C:
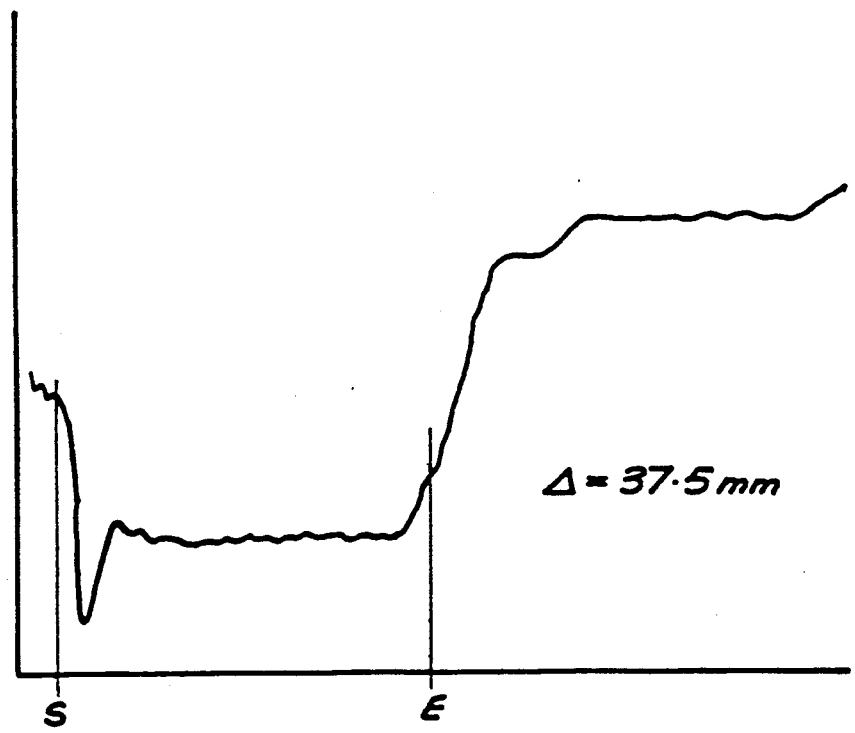

For insertion or coaxial probes we expect the ratio of travel times when the probe is immersed in water to that in air to be about 9:1. Using the results in FIG. 17 we find the ratio for the surface probe is 4.34:1. Clearly the sensitivity of the surface probes will be about ½ that of conventional probes but this is still sufficiently accurate for water content determination.

We have presented designs for surface TDR probes which eliminate the need for inserting probes in porous materials, liquids and slurries. Model calculations show that the depth of field penetration of these probes is approximately equal to the width of the probe. In addition the dielectric filler should have as low a dielectric constant as possible. These calculations also demonstrated that extension of the outer shield along the material surface increases the depth of field penetration of the field.

These probes give crisp, clear signals with sensitivity about ½ that of insertion probes. Even with this decrease in sensitivity accurate water and liquid content distributions may be made.

These probes sample in the near surface region of materials and we envisage that they will be used in following wetting, drying and evaporation from porous materials, slurries and liquids, and in liquid content and electrical conductivity logging in unlined bore holes.

It will be appreciated by those skilled in the art that further embodiments of the invention are possible without departing from the spirit or scope of the invention described.

TABLE 1

Comparison of Characteristic Probe Impedances
L-150 mm, K-81

| Probe | Probe Dimension 2s/d (mm/mm) | $z_0$(Ohm) Geometric Eq. (12) | $z_0$(Ohm) Measured Eq. (13) | Ratio Geometric Measured |
|---|---|---|---|---|
| Three-wire | 60/4.76 | 152.1 | 198.6 | 0.766 |
| Four-wire | 60/4.76 | 152.1 | 173.9 | 0.875 |
| Coaxial cell | 72.8/4.76 | 163.6 | 177.1 | 0.924 |

We claim:

1. A portable probe for use in the measurement of moisture content, solids contents, and electrical conductivity of porous materials, slurries, and liquids using Time Domain Reflectometry comprising a conductive wire or rod supported in spaced relation from a conductive plate by spacer means of dielectric material, said spacer means arranged to allow the material whose characteristics are to be measured to pass between said wire or rod and said plate.

2. A portable probe according to claim 1 wherein said spacer means comprise upstanding formations located at opposite sides of said plate with said wire or rod bridging said formations.

3. A portable probe according to claim 1 having connector means for connecting to a coaxial line, said connector means adapted to connect said conductive plate to the shield of said coaxial line and the rod or wire to the center conductor of said coaxial line.

4. A portable probe according to claim 2 having connector means for connecting to a coaxial line, said connector means adapted to connect said conductive plate to the shield of said coaxial line and the rod or wire to the center conductor of said coaxial line.

5. An improved strip-line surface probe for use in the measurement of moisture content, solids contents, and electrical conductivity of porous materials, slurries, and liquids using Time Domain Reflectometry, the improvement comprising at least one center conductor partially but not wholly surrounded at least in part by a shield conductor spaced from said center conductor by a dielectric filler medium, said center conductor in use being placed in contact with the material whose characteristics are being measured.

6. An improved strip-line surface probe according to claim 5 wherein the shield conductor is extended by means of wing extension portions extending outwardly from base edges of said shield conductor.

* * * * *